United States Patent [19]

Kinoshita

[11] Patent Number: 4,728,823

[45] Date of Patent: Mar. 1, 1988

[54] LOGIC CIRCUIT TESTABLE AS AN INVERTER PAIR AND OPERABLE AS A FLIP-FLOP

[75] Inventor: Tsuneo Kinoshita, Kokobunji, Japan

[73] Assignee: Tokyo Shibaura Denki Kabushiki Kaisha, Kawasaki, Japan

[21] Appl. No.: 888,273

[22] Filed: Jul. 22, 1986

Related U.S. Application Data

[63] Continuation of Ser. No. 564,193, Dec. 22, 1983, abandoned.

[30] Foreign Application Priority Data

Dec. 27, 1982 [JP] Japan .................... 57-226965

[51] Int. Cl.[4] ............................. H03K3/356
[52] U.S. Cl. .................... 307/451; 307/279; 307/291; 307/469; 324/73 R
[58] Field of Search .......... 307/247 R, 279, 291, 307/445, 451, 465, 468, 469, 303; 324/73 R; 371/25; 377/79, 81, 117

[56] References Cited

U.S. PATENT DOCUMENTS

| | | | |
|---|---|---|---|
| 3,460,098 | 8/1969 | Blauw | 377/81 X |
| 3,761,695 | 9/1973 | Eichelberger | 371/25 |
| 3,943,378 | 3/1976 | Beutler | 377/117 |
| 4,071,902 | 1/1978 | Eichelberger et al. | 324/73 R X |
| 4,441,075 | 4/1984 | McMahon | 371/25 X |
| 4,477,738 | 10/1984 | Kouba | 324/73 R |
| 4,513,418 | 4/1985 | Bardell, Jr. et al. | 371/25 |

OTHER PUBLICATIONS

Hnatek, *User's Guidebook to Digital CMOS Integrated Circuits;* McGraw-Hill Book Co.; 1981; pp. 19-34.

*Primary Examiner*—Stanley D. Miller
*Assistant Examiner*—D. R. Hudspeth
*Attorney, Agent, or Firm*—Cushman, Darby & Cushman

[57] ABSTRACT

A logic circuit on a substrate is switchable between a test mode and an operational mode. First and second NOR gates are cross-coupled and may be switched between an operational mode and a test mode by the application of a control signal to first and second transfer gates coupled to the inputs of the NOR gates. The first NOR gate includes a p-type region and an n-type region formed in said substrate and traversed with first and second conductive layers insulated from the p and n-type regions. Thus, the first NOR gate includes two p-channel transistors and two n-channel transistors. The second NOR gate is also formed by a p-type region and an n-type region traversed with third and fourth conductive layers. Thus, the second NOR gate also includes two p-channel transistors and two n-channel transistors. The transfer gates are located on the substrate between the first and second NOR gates. Both transfer gates include an n-type region formed in the substrate with a conductive layer disposed over the n-type region. In the operational mode, the cross-coupled NOR gates may perform as a flip-flop. In the test mode, each NOR gate essentially becomes an inverter.

4 Claims, 6 Drawing Figures

LOGIC CIRCUIT TESTABLE AS AN INVERTER PAIR AND OPERABLE AS A FLIP-FLOP

This is a continuation of application Ser. No. 564,193, filed Dec. 22, 1983, which was abandoned upon the filing hereof.

BACKGROUND OF THE INVENTION

The present invention relates to a logic circuit functioning as a flip-flop.

Use of the gate array has successfully reduced the design period of custom-circuit LSIs to anywhere from two or three months. The gate array is a semiconductor chip having a great number of logic cells, e.g., 2-input NAND or NOR gates, which cells are arrayed in a matrix fashion over a sufficient area of the chip.

To implement a custom-circuit logic function on a chip, a designer (as a user) selects an appropriate gate array from among various types of gate arrays, and interconnects logic cells with a dedicated metal pattern on the gate array chip. Therefore, with the omission of the design work of the semiconductor chip, the bulk of his design work for LSI development merely entails the laying out of the metal pattern for interconnecting the logic cells. Thus, the design period is greatly shortened, compared to that of the LSIs not having gate arrays.

The gate arrays, which are commercially available, serve as base components in designing and manufacturing custom-circuit LSIs. For this reason, the design cost can be shared among the users, resulting in an overall cost reduction of the LSIs. This cost reduction resulting from the use of gate arrays becomes effective in the production of from 2,000 to 3,000 or more LSIs.

The gate array suffers from the following defects, however. First, the integration density of the logic cells on the gate array chip is low, due to the need to ensure the flexibility of the interconnection. Also, a redundancy in the length of the metal pattern must be accepted in designing the custom-circuit LSIs. This redundancy impairs the operational speed of the custom-circuit LSIs.

In a defect inspection of newly manufactured custom-circuit LSIs, test data is applied to the custom-circuit LSIs on the chips, to check a circuit response. In cases wherein custom-circuit LSIs contain a number of flip-flops, such as CPUs, various items of test data must be prepared for the LSIs' defect inspection. Therefore, since the test data is structurally complex, the preparation of such data imposes heavy and troublesome work on the designers.

To lighten the load of testing requirements, one approach used is the so called LSSD (level sensitive scan design), in which a plurality of flip-flops are operated as a shift register at the time of the defect inspection. This approach requires a number of additional lines and circuit elements, however. Therefore, when the LSSD circuit is formed on a gate array chip bearing logic cells with a low integration density, the need for a great number of components restrains the effective chip area; and, thus, might possibly render the metal pattern even more rendundant.

SUMMARY OF THE INVENTION

Accordingly, the primary object of the present invention is to provide a logic circuit which can facilitate the defect inspection of a LSI circuit.

According to the present invention, a logic circuit is provided, which comprises first and second gate circuits having at least first and second inputs and one output, and for producing signals according to a combination of input signals; a switching section for selecting one of first and second operation mode in accordance with a control signal, and wherein the switching section, in the first operation mode, connects the output of the first gate circuit to the first input of the second gate circuit, and connects the output of the second gate circuit to the first input of the first gate circuit, and, in the second operation mode, disconnects at least one of the first and second gate circuits from the first input of the other gate circuit.

DETAILED DESCRIPTION OF THE PREFERRED EMBODIMENTS

Figure 1:
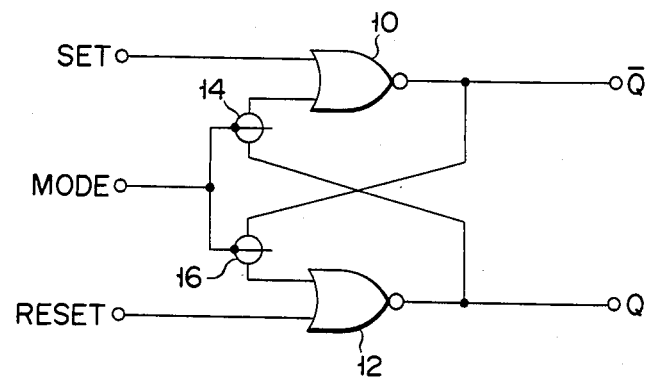
FIG. 1 is a logic circuit of an embodiment according to the present invention.

FIG. 1 shows a logic circuit according to an embodiment of the present invention. This logic circuit is provided with 2-input NOR gates 10 and 12 and transfer gates 14 and 16. A first input of the NOR gate 10 is connected to a SET input terminal. A second input of the NOR gate 10 is connected to the output of the NOR gate 12, via the transfer gate 14. The output of the NOR gate 10 is connected to the $\bar{Q}$ output terminal. The first input of the NOR gate 12 is connected to a RESET input terminal. The second input of the NOR gate 12 is connected to the output of the NOR gate 10 via the transfer gate 16. The output of the NOR gate 12 is connected to the O output terminal. The control inputs of the transfer gates 14, 16 are interconnected and joined to a MODE select terminal which is supplied with a control signal for selecting the first and second operation modes (i.e., the flip-flop mode and test mode).

In the flip-flop mode operation, a low level control signal "L" is supplied to a MODE select terminal. The transfer gate 14 and 16 are rendered conductive in response to control signal "L" and permit the passage of the respective signals therethrough. At this juncture, the output signal from NOR gate 12 is fed to NOR gate 10, through transfer gate 14, and the output signal of NOR gate 10 is fed to NOR gate 12, via transfer gate 16. Thus, cross-coupled NOR gates 10 and 12 may cooperate to serve as an RS flip-flop. For example, when the SET signal (i.e., high level signal "H") is supplied to the SET input terminal, the NOR gate 10 produces a low level signal "L" in response to the SET signal supplied from the SET input terminal. This output signal "L" is fed to the NOR gate 12 through the transfer gate 16 and $\overline{Q}$ output terminal. At this time, if the RESET signal (i.e., high level signal "H") is not input to the RESET input terminal, NOR gate 12 produces a signal "H" at the Q output terminal. The output signal "H" from NOR gate 12 is fed to NOR gate 10, through transfer gate 14. Therefore, NOR gate 10 continuously produces signal "L", even if the supply of the SET signal is stopped; and, then, NOR gate 12 continuously produce signal "H" in response to the signal "L" derived from NOR gate 10. When the RESET signal "H" is applied to the RESET input terminal, NOR gate 12 produces a signal "L" at the Q output in response to the RESET. Then, the signal "H" derived from NOR gate 10 appears at the Q output terminal. Thus, NOR gates 10 and 12 are symmetrically connected to each other.

In the test mode operation, a high level control signal "H" is supplied to the MODE select terminal. Transfer gates 14 and 16 respond to the control signal "H" and are turned off and reject the passage of signals therethrough. As a result, NOR gates 10 and 12 are not supplied with the Q and $\overline{Q}$ output signals; and, hence, those gates merely invert the signals from the SET and RESET input terminals, and produce them at the Q and $\overline{Q}$ output terminals, respectively.

In the logic circuit, a desired operation mode can be designated by the control signal. The logic circuit serves as an RS flip-flop in the flip-flop mode, and as a couple of inverters in the test mode. If such logic circuits are used as parts for a custom-circuit requiring a number of RS flip-flops, such as a CPU, and, if all logic circuits assembled into the CPU are operated in the test mode at the time of the defect inspection, it is possible to find a defect or defects of the custom-circuit by merely supplying simple test data, except in the feed lines for cross-coupling of the logic circuits.

Figure 2:
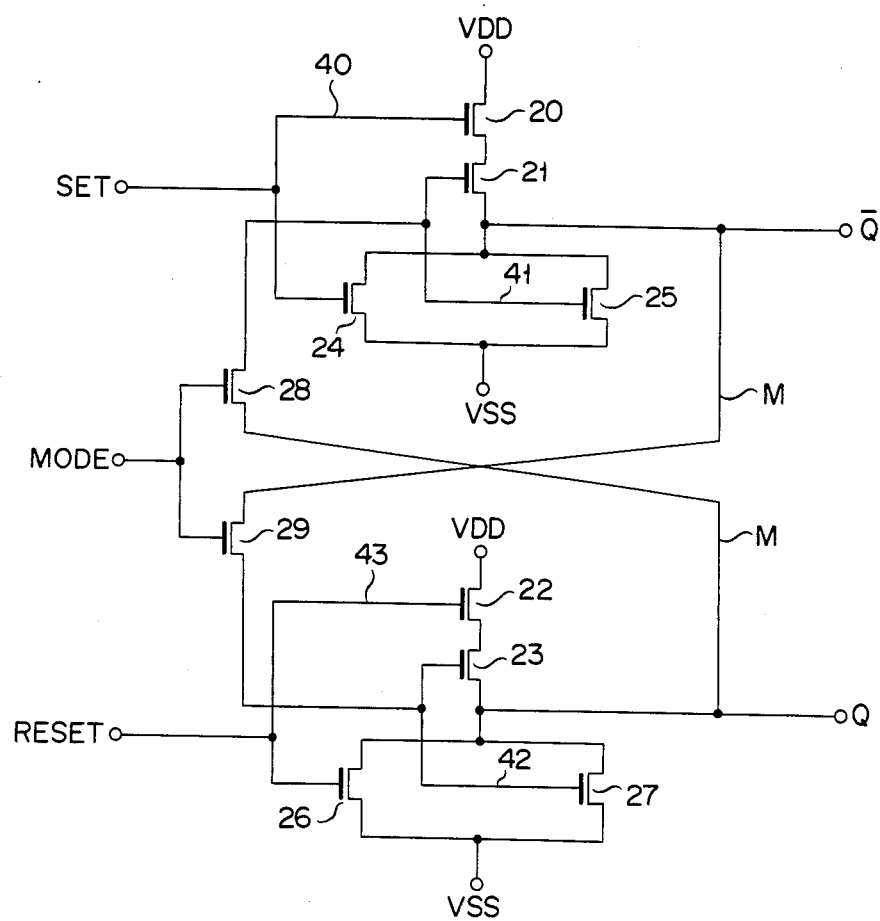
FIG. 2 is a logic circuit which contains CMOS transistors and is equivalent to the logic circuit of FIG. 1.

FIG. 2 shows a practical arrangement of the logic circuit shown in FIG. 1, in which arrangement CMOS transistors are used, allowing for its organization on the semiconductor chip. In particular, p-channel transistors 20 to 23 are provided for the NOR gates 10, 12; and n-channel transistors 28 and 29 are provided for the transfer gates 14, 16, as shown in FIG. 1. The gates of transistors 20 and 24 are interconnected and are joined to the SET input terminal. The gates of transistors 22 and 26 are interconnected and joined to the RESET input terminal. A series circuit of transistors 20 and 21 is connected, at one end, to a VDD terminal, at the other end, to a VSS terminal via a parallel circuit of transistors 24 and 25, and, further, to the $\overline{Q}$ output terminal. The gates of transistors 23 and 27 are connected to the $\overline{Q}$ output terminal, via transistor 29. A series circuit of transistors 22 and 23 is connected at one end to the VDD terminal, and, at the other end, to a VSS terminal through a parallel circuit of transistors 26 and 27, and, further, to the Q output terminal. The gates of transistors 21 and 25 are coupled to the Q output terminal, via transistor 28. The gates of transistors 28 and 29 are jointly connected to a MODE select terminal supplied with the control signal.

A description of the operation of the logic circuit of FIG. 2 may be given as follows. The p-channel transistors 20 to 23 are turned ON and OFF, in response to signals "L" and "H", respectively. The n-channel transistors 24 to 29 are turned OFF in response to the signal "L", and turned ON in response to the signal "H". For example, when the control signal "L" is supplied to a MODE select terminal, the Q and $\overline{Q}$ output signals are interrupted by the transistors 28 and 29 being placed in an OFF state, to keep the gate voltage of the transistors 21, 23, 25 and 27 at low level. Therefore, the transistors 21 and 23 are conductive, while the transistors 25 and 27 are non-conductive. The input signal at the SET input terminal is inverted by a CMOS inverter of p- and n-channel transistors 20 and 24, and appears at the Q output terminal. The input signal at the RESET input terminal is likewise inverted by a CMOS inverter of transistors 22 and 26, and is applied to the Q output terminal.

When the control signal "H" is applied to the MODE select terminal, transistors 28 and 29 are turned ON. The Q output is passed through transistor 28 to transistors 21 and 25, while the $\overline{Q}$ output signal is fed to transistors 23 and 27, through transistor 29. As the combination of the transistors 20, 21, 24, 25 which corresponds to NOR gate 10 (FIG. 1), and the combination of the transistors, 22, 23, 26, 27 which corresponds to NOR gate 10 (FIG. 1) are cross-coupled with each other, the above-mentioned RS flip-flop function is realized.

Figure 3:
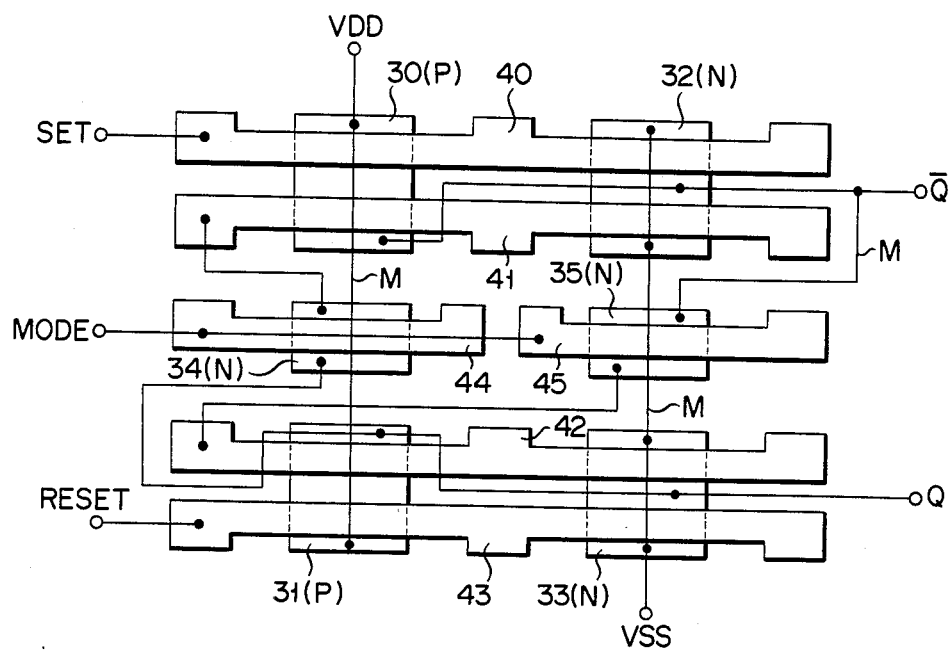
FIG. 3 is a plan view of a portion of a gate array chip containing one block of logic cells.

Shown in FIG. 3 is one block of logic cells on a gate array chip. The gate array chip is provided with a number of blocks of logic cells, which cells can be connected to build any logic function. Logic cells of one block each contain a couple of 2-input NOR gates and a couple of transfer gates, enough to build the logic circuit of FIG. 2. The logic cells in FIG. 3 are interconnected, for example, to form the logic circuit of FIG. 2, with a metal pattern as indicated by the solid line M. In manufacture, the P and N-type regions 30–33 may be deposited after conductive strips 40–43 are laid down.

The logic cells of FIG. 3 may now be described in greater detail. The p-type semiconductor layers 30 and 31 and n-type semiconductor layers 32 to 35 are formed on the gate array, while being appropriately spaced apart from one another. Conductive layers 40 to 45 are layered on the semiconductor layers 30 to 35, through an insulating layer (not shown). The transistors 20, 24 of FIG. 2 are formed in the semiconductor layers 30, 32, through a conductive layer 40 providing gates. The transistors 21 and 25 of FIG. 2 are likewise formed in the semiconductor layers 30 and 32 through the conductive layer 41 interposed therebetween. The transistors 23 and 27 of FIG. 2 are formed in the semiconductor layers 31 and 33 through the conductive layer 42. Similarly, the transistors 22, 26 of FIG. 2 are formed in the semiconductor layers 31 and 33 through the conductive layer 43. Transistor 28 is formed in the semiconductor layer 34, through the conductive layer 44, and the transistor 29 is formed in the semiconductor layer 35, through the semiconductor layer 45.

With such an arrangement of transistors, the metal pattern M for the logic circuit of FIG. 2 can not be redundant.

Figure 4:
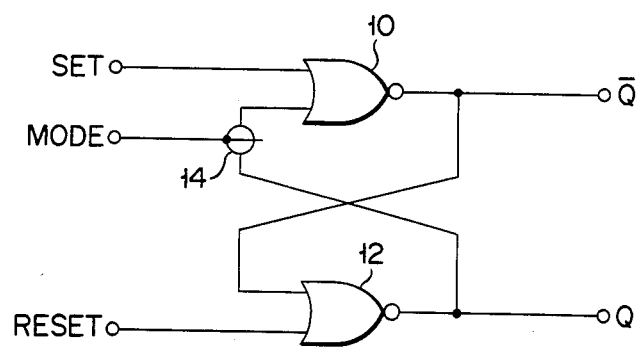
FIG. 4 is a logic circuit of another embodiment according to the present invention, which embodiment is featured by using one of the transfer gates of the FIG. 1.

FIG. 4 shows a logic circuit according to a second embodiment of the present invention. This logic circuit is provided with a coupled of 2-input NOR gates 10, 12 and a transfer gate 14, which components are the same as those of FIG. 1. In this embodiment, however, the transfer gate 16 of FIG. 1 is not used. In the logic circuit, the second input of NOR gate 12 is directly connected to the output of NOR gate 10. With this exception, the logic circuit of FIG. 4 has an interconnection similar to that of the logic circuit of FIG. 1.

In actual operation, when the control signal "L" is input to the MODE select terminal, the transfer gate 14 is turned ON in response to the control signal "L". At this juncture, the Q output of NOR gate R is fed to NOR gate 10, through a transfer gate 14. In other words, the NOR gates 10, 12 are cross-coupled with each other and serve as an RS flip-flop. When the control signal "H" is supplied to the MODE select terminal, the transfer gate 14 is turned OFF in response to the control signal "H".

As a result, the Q output signal of NOR gate 12 is shut off at the transfer gate 12 and, during the period of this shutting off of the signal, the voltage level on the second input of NOR gate 10 is low. NOR gate 10 inverts the input signal on the SET input terminal and produces an inverted one at the $\overline{Q}$ output terminal. NOR gate 12 receives the output signal from NOR gate 10 and the signal from the RESET input terminal to generate an output signal based on those received signals and outputs it at the Q output terminal.

With the arrangement of this embodiment, the output signal from the NOR gate 10 is supplied to NOR gate 12 in the test mode. Thus, it is further possible to find defects on the feed line which couples the output of NOR gate 10 and the second input of the NOR gate 12.

Figure 5:
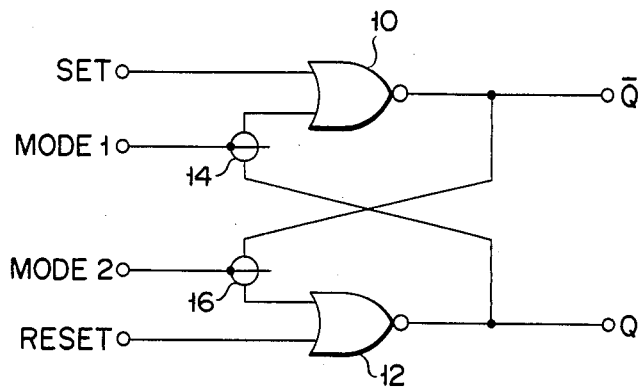
FIG. 5 is a logic circuit of yet another embodiment according to the present invention, which embodiment is featured in that transfer gates of FIG. 1 are respectively supplied with control signals.

FIG. 5 shows a logic circuit according to a third embodiment of the present invention. This logic circuit is provided with a couple of 2-input NOR gates 10, 12 and a couple of transfer gates 14, 16, as in the embodiment of FIG. 1. The transfer gates 14 and 16 are respectively connected to a MODE-1 select terminal to be supplied with a first control signals and a MODE-2 select terminal to be supplied with a second control signal. Except for this circuit connection, the logic circuit of FIG. 5 has an interconnection similar to that of FIG. 1.

During the flip-flop mode operation, when the control signal "L" is supplied to the MODE-1 and MODE-2 select terminals, transfer gates 14 and 16 are turned ON, respectively, in response to the control signals "L" from the MODE-1, MODE-2 select terminals. With this circuit operation, the NOR gates 10, 12 cooperate to provide an RS flip-flop, as in the first and second embodiments.

In a test mode, when the control signal "H" is supplied to the MODE-1 and MODE-2 select terminals, transfer gates 14 and 16 are turned OFF, respectively, in response to the control signals "H" from the corresponding select terminals. NOR gates 10 and 12, respectively, invert the input signals from the SET and RESET input terminals, and supply the inverted ones to the $\overline{Q}$ and Q output terminals. NOR gates 10 and 12 produce output signals as in the case wherein the logic circuit of FIG. 1 operates in the test mode.

When control signals "H" and "L" are applied to the MODE-1 and MODE-2 select terminals, respectively, the transfer gate 14 is turned OFF in response to control signal "H", while the transistor 16 is turned ON in response to control signal "L". Then, NOR gates 10 and 12 respectively produce output signals at the $\overline{Q}$ and Q output terminals, as in the case wherein the logic circuit of FIG. 2 operates in the test mode. On the other hand, when control signals "L" and "H" are respectively applied to the MODE-1 and MODE-2 select terminals, transistors 14 and 16 are respectively turned on and off.

In other words, the logic circuit of this embodiment has four types of functions. Therefore, if the combination of the states of the control signals "H" or "L" applied to MODE-1 and MODE-2 is changed, it is further possible to find defects on the feed lines which cross-couple the NOR gates 10 and 12.

Figure 6:
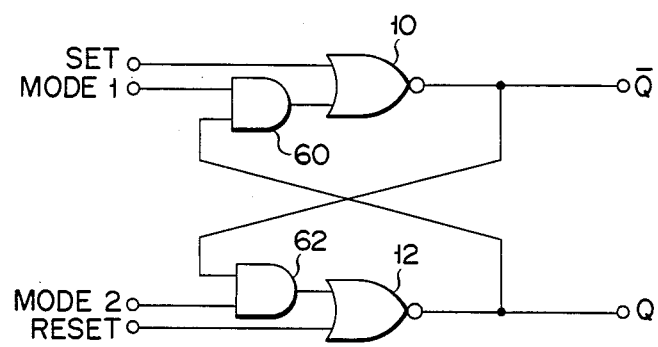
FIG. 6 is a logic circuit of a further embodiment according to the present invention, which embodiment is featured in that transfer gates of FIG. 5 are replaced by AND gates, respectively.

FIG. 6 shows a logic circuit according to a fourth embodiment of the present invention. This logic circuit, similar to the logic circuit of FIG. 5, uses AND gates 60 and 62 in place of transfer gates 14 and 16. The second input of the NOR gate 10 is connected to the output of the NOR gate 12 via the AND gate 60. The second input of the NOR gate 12 is connected to the output of the NOR gate 10 via the AND gate 62. And gates 60 and 62 are connected to the MODE-1 and MODE-2 select terminals, respectively. Except for the above connection, this embodiment has an interconnection similar to that of the FIG. 5 embodiment.

The AND gates 60, 62 permit the signals to pass therethrough in response to the control signals "H" derived from the corresponding select terminals. Further, these gates interrupt the passage of the signals in response to the other control signals "L".

The logic circuit with such a circuit arrangement can be organized on the gate array chip having only NOR gate logic cells.

As may be seen from the foregoing description, the logic circuit according to the present invention can designate a desired operation mode by using a control signal. In the manufacturing stage of the custom-circuit, the logic circuit is used as a flip-flop; and, at the time of the defect inspection of the custom-circuit, the operation mode of the logic circuit is set to the test mode by using the control signal. In this way, the defect inspecting work can be performed easily. The logic circuit operating in the test mode produces a signal based on the mere combination of the input signals. Therefore, the work load of designers in preparing the test data is remarkably reduced, as compared of the conventional test data preparation work.

The logic circuit is effective in use, particularly when the custom-circuit is formed on the semiconductor chip. When the gate array is designed to allow for an interconnection adaptable to such a logic circuit, there is no need for the additional use of the inspection-easing-circuit based on the LSSD. Further, being structurally simple, the custom circuit does not occupy excessive area on the chip. Moreover, the transfer gate cells on the gate array chip may be used in organizing circuits other than the logic circuit, if necessary, for custom-circuit organization. In this respect, the gate array is decidedly flexible in use.

While NOR gates are used in realizing the RS flip-flop function in the above embodiments, these may be replaced by NAND gates. The essential feature of this invention lies in its ability to provide a switching means on a feed line of cross-coupling for a flip-flop function.

What is claimed is:

1. A logic circuit on a substrate layer of a gate array device having a surface area with n-type and p-type regions formed therein, comprising:
   first and second input terminals;
   first and second output terminals;
   a control input;
   a $V_{DD}$ terminal;
   a first NOR gate including first p-type and first n-type regions formed in the surface area of said substrate layer and first and second conductive layers each insulatively formed over and across said first p-type and first n-type regions, said first p-type region forming first and second p-channel MOS transistors in cooperation with said first and second conductive layers, said first n-type region forming first and second n-channel MOS transistors in cooperation with said first and second conductive layers, said first and second p-channel MOS transistors and said first and second n-channel MOS transistors being interconnected to have a complementary structure, said first p-channel MOS transistor being coupled to said first input terminal and said $V_{DD}$ terminal, said second n-channel MOS transistor being coupled to said first output terminal;

a second NOR gate including second p-type and second n-type regions formed in the surface area of said substrate layer and third and fourth conductive layers each insulatively formed over and across said second p-type and second n-type regions, said second p-type region forming third and fourth p-channel MOS transistors in cooperation with said third and fourth conductive layers, said second n-type region forming third and fourth n-channel MOS transistors in cooperation with said third and fourth conductive layers, said third and fourth p-channel MOS transistors and said third and fourth n-channel MOS transistors being interconnected to have a complementary structure, said third p-channel MOS transistor being coupled to said second input terminal and said $V_{DD}$ terminal, said fourth n-channel MOS transistor being coupled to said second output terminal; and first and second transfer gates for selectively cross-coupling and separating said first and second NOR gates under the control of a control signal applied to said first and second transfer gates from said control input, said first transfer gate being located on said substrate layer between said first and second p-type regions, said second transfer gate being located on said substrate layer between said first and second n-type regions, a drain of said first transfer gate being coupled to a gate of said second p-channel MOS transistor by a first metal connector, a drain of said second transfer gate being coupled to a gate of said fourth p-channel MOS transistor by a second metal connection, said first and second metal connections each having a length selected to reduce capacitance between said each metal connection and said substrate layer, said control signal having a timing selected to permit natural discharge of said second and fourth p-channel MOS transistors, an input of said first transfer gate being coupled to an output of said fourth p-channel MOS transistor, an input from said second transfer gate being coupled to an output from said second p-channel MOS transistor.

2. A logic circuit according to claim 1, wherein said first transfer gate includes a third n-type region formed in the surface area of said substrate layer and a fifth conductive layer insulatively formed over said third n-type region, and said second transfer gate includes a fourth n-type region formed in the surfacer area of said substrate layer and a sixth conductive layer insulatively formed over said fourth n-type region. KINOSHITA---Continuation of Serial No. 564,193

3. A logic circuit on a substrate switchable between a test mode and an operational mode, said substrate having a surface layer with n-type and p-type regions formed therein comprising:

first and second input terminals;
first and second output terminals;
a control input;
a $V_{DD}$ terminal;
a $V_{SS}$ terminal;

a first NOR gate including:
  a first transistor formed by a first p-type region on said substrate and a first conductive layer insulatedly disposed over said first p-type region, an input of said first transistor being coupled to said $V_{DD}$ terminal, a gate electrode of said first transistor being formed by said first conductive layer which is coupled to said first input terminal;
  a second transistor formed by said first p-type region and a second conductive layer insulatedly disposed over said first p-type region, an output of said second transistor being coupled to said first output terminal, a gate electrode of said second transistor being formed by said second conductive layer;
  a third transistor formed by a first n-type region on said substrate and said first conductive layer insulatedly disposed over said first n-type region, an output of said third transistor being coupled to said first output terminal, an input of said third transistor being coupled to said $V_{SS}$ terminal, a gate electrode of said third transistor being formed by said first conductive layer; and
  a fourth transistor formed by said first n-type region and said second conductive layer insulatedly disposed over said first n-type region, an output of said fourth transistor being coupled to said first output terminal, an input of said fourth transistor being coupled to said $V_{SS}$ terminal, a gate electrode of said fourth transistor being formed by said second conductive layer;

a second NOR gate including:
  a fifth transistor formed by a second p-type region on said substrate and a third conductive layer insulatedly disposed on said second p-type region, an output of said fifth transistor being coupled to said second output terminal, a gate electrode of said fifth transistor being formed by said third conductive layer;
  a sixth transistor formed by said second p-type region and a fourth conductive layer insulatedly disposed over said second p-type region, an output of said sixth transistor being coupled to said $V_{DD}$ terminal, a gate electrode of said sixth transistor being formed by said fourth conductive layer which is coupled to said second input terminal;
  a seventh transistor formed by a second n-type region on said substrate and said third conductive layer insulatedly disposed over said second n-type region, an input of said seventh transistor being coupled to said $V_{SS}$ terminal, an output of said seventh transistor being coupled to said second output terminal, a gate electrode of said seventh transistor being formed by said third conductive layer; and
  an eighth transistor formed by said second n-type region and said fourth conductive layer insulatedly disposed over said second n-type region, an input of said eighth transistor being coupled to said $V_{SS}$ terminal, an output of said eighth transistor being coupled to said second output terminal, a gate electrode of said eighth transistor being formed by said fourth conductive layer;

first transfer gate means for selectively cross-coupling and separating said first and second NOR gates in response to a control signal input through said control input, said first transfer gate means being located on said substrate between said first and second p-type regions and having an output coupled to said second conductive layer, an input coupled to the output of said fifth transistor, and a gate electrode coupled to said control input, said first transfer gate means output being coupled to said gate electrode of said second transistor by a first metal connection;

second transfer gate means for selectively cross-coupling and separating said first and second NOR gates in response to said control signal input through said control input, said second transfer gate means located on said substrate between said first and second n-type regions and having an output coupled to said third conductive layer, an input coupled to the output of said second transistor, and a gate electrode coupled to said control input, said second transfer gate means being coupled to said gate electrode from said fifth transistor by a second metal connection, said first and second metal connections each having a length selected to reduce capacitance between said each metal connection and said substrate, said control input receiving a signal whose timing is selected to permit natural discharge of said second and fifth transistors.

4. A logic circuit according to claim 3 wherein said first transfer gate includes a third n-type region formed on said substrate, and a fifth conductive layer insulatedly disposed over said third n-type region, and wherein said second transfer gate includes a third p-type region formed on said substrate, and a sixth conductive layer insulatedly disposed over said third p-type region.

* * * * *